US012615042B2

(12) United States Patent
Yang et al.

(10) Patent No.: US 12,615,042 B2
(45) Date of Patent: Apr. 28, 2026

(54) DUTY CYCLE CORRECTION CIRCUIT

(71) Applicant: SHENZHEN PANGO MICROSYSTEMS CO., LTD, Shenzhen (CN)

(72) Inventors: Fan Yang, Shenzhen (CN); Yongcheng Zhai, Shenzhen (CN); Yuanjun Liang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 0 days.

(21) Appl. No.: 18/757,524

(22) Filed: Jun. 28, 2024

(65) Prior Publication Data

US 2024/0348239 A1 Oct. 17, 2024

Related U.S. Application Data

(63) Continuation of application No. PCT/CN2022/091307, filed on May 6, 2022.

(30) Foreign Application Priority Data

Dec. 30, 2021 (CN) .......................... 202111664241.2

(51) Int. Cl.
*H03K 5/156* (2006.01)
*H03K 5/133* (2014.01)
*H03K 5/00* (2006.01)

(52) U.S. Cl.
CPC ........... *H03K 5/1565* (2013.01); *H03K 5/133* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 6,566,925 B2 * | 5/2003 | Ma | ........................ | H03K 5/1565 |
| | | | | 327/175 |
| 8,451,037 B2 * | 5/2013 | Ahn | ...................... | H03K 5/1565 |
| | | | | 327/175 |
| 2012/0218015 A1 * | 8/2012 | Satoh | .................... | H03L 7/0816 |
| | | | | 327/158 |
| 2019/0272804 A1 * | 9/2019 | Amirkhany | ............ | H03K 21/38 |
| 2020/0057465 A1 * | 2/2020 | Huang | ...................... | G06F 1/08 |

* cited by examiner

*Primary Examiner* — Cassandra F Cox

(57) ABSTRACT

The present application discloses a duty cycle correction circuit. The duty cycle correction circuit includes signal input terminal; a signal adjustment circuit electrically connected to the signal input terminal and configured to receive a first clock signal and convert the first clock signal into a second clock signal; a duty cycle detection circuit electrically connected to the signal adjustment circuit and configured to detect a duty cycle of the second clock signal and generate a feedback result; and a digital control delay circuit electrically connected to the duty cycle detection circuit, the signal adjustment circuit and the signal input terminal, respectively. The digital control delay circuit is configured to, according to the feedback result, perform a corresponding delay operation on the second clock signal generated by the signal adjustment circuit.

8 Claims, 3 Drawing Sheets

DUTY CYCLE CORRECTION CIRCUIT

CROSS-REFERENCE TO RELATED APPLICATIONS

This application is a Bypass Continuation Application of PCT International Application No. PCT/CN2022/091307 filed on May 6, 2022, which claims priority to Chinese Patent Application No. 202111664241.2, filed on Dec. 30, 2021 and entitled "DUTY CYCLE CORRECTION CIRCUIT", the entire contents of which are incorporated herein by reference.

FIELD OF THE DISCLOSURE

The present application relates to the field of integrated circuit technology, specifically to a duty cycle correction circuit.

BACKGROUND

In modern high-speed large-scale integrated circuits, quality requirements for clock signals are becoming increasingly higher. In addition to traditional clock jitter, a clock duty cycle in the quality of clock signals is also becoming a key factor affecting performance of high-speed integrated circuits, and clock signals with a duty cycle of 50% are particularly important in high-speed large-scale integrated circuits. In a memory, a duty cycle of 50% can maximize utilization efficiency of clock levels, thereby ensuring normal operation of a system and best performance. At present, in a duty cycle correction circuit, a duty cycle detection circuit has fixed capacitance during design, and different process corner parameters will have different charging and discharging speeds, which will cause capacitance elements in the duty cycle detection circuit to discharge too early too fast or too late too slowly. In actual operation, a duty cycle of a clock circuit often deviates from 50%. In current RF and communication fields, many circuits require an input clock signal to have a high-precision 50% duty cycle. However, with increase in frequency, in order to ensure frequency accuracy and low phase noise, it is usually difficult for phase-locked loop output to ensure that the duty cycle is within a small range near 50%.

SUMMARY

An object of the present application is to provide a duty cycle correction circuit, which can solve the problem of difficulty in stabilizing the duty cycle around a range near 50%.

In order to solve the above problem, the present application provides a duty cycle correction circuit, which includes:

a signal input terminal and a signal output terminal;

a signal adjustment circuit electrically connected to the signal input terminal and the signal output terminal, respectively; wherein the signal adjustment circuit is configured to receive a first clock signal input from the signal input terminal, convert the first clock signal into a second clock signal and output the second clock signal from the signal output terminal;

a duty cycle detection circuit electrically connected to the signal adjustment circuit; wherein the duty cycle detection circuit is configured to detect a duty cycle of the second clock signal and generate a feedback result; and a digital control delay circuit electrically connected to the duty cycle detection circuit, the signal adjustment circuit and the signal input terminal, respectively; wherein digital control delay circuit is configured to, according to the feedback result, perform a corresponding delay operation on the second clock signal generated by the signal adjustment circuit.

Compared with the related art, in the present application, the signal adjustment circuit receives an input first clock signal, and converts the first clock signal into the second clock signal; the duty cycle detection circuit is electrically connected to the signal adjustment circuit, and is used to detect a duty cycle of the second clock signal and generate a feedback result; the digital control delay circuit is electrically connected to the duty cycle detection circuit, the signal adjustment circuit and the signal input terminal, respectively, and is used to perform a corresponding delay operation, according to the feedback result, on the second clock signal generated by the signal adjustment circuit. The signal adjustment circuit, the duty cycle detection circuit and the digital control delay circuit in the duty cycle correction circuit can effectively solve conflict between establishment of accumulated time and loop stability, thereby satisfying the requirement of an input clock signal with a high-precision 50% duty cycle.

DETAILED DESCRIPTION OF PREFERRED EMBODIMENTS

In order to make objects, technical solutions and advantages of the present application more apparent, the present application will be described hereinafter in details in conjunction with the accompanying drawings and embodiments. It is to be understood that the specific embodiments described herein are only used to explain the present application and are not used to limit the present application.

Figure 1:
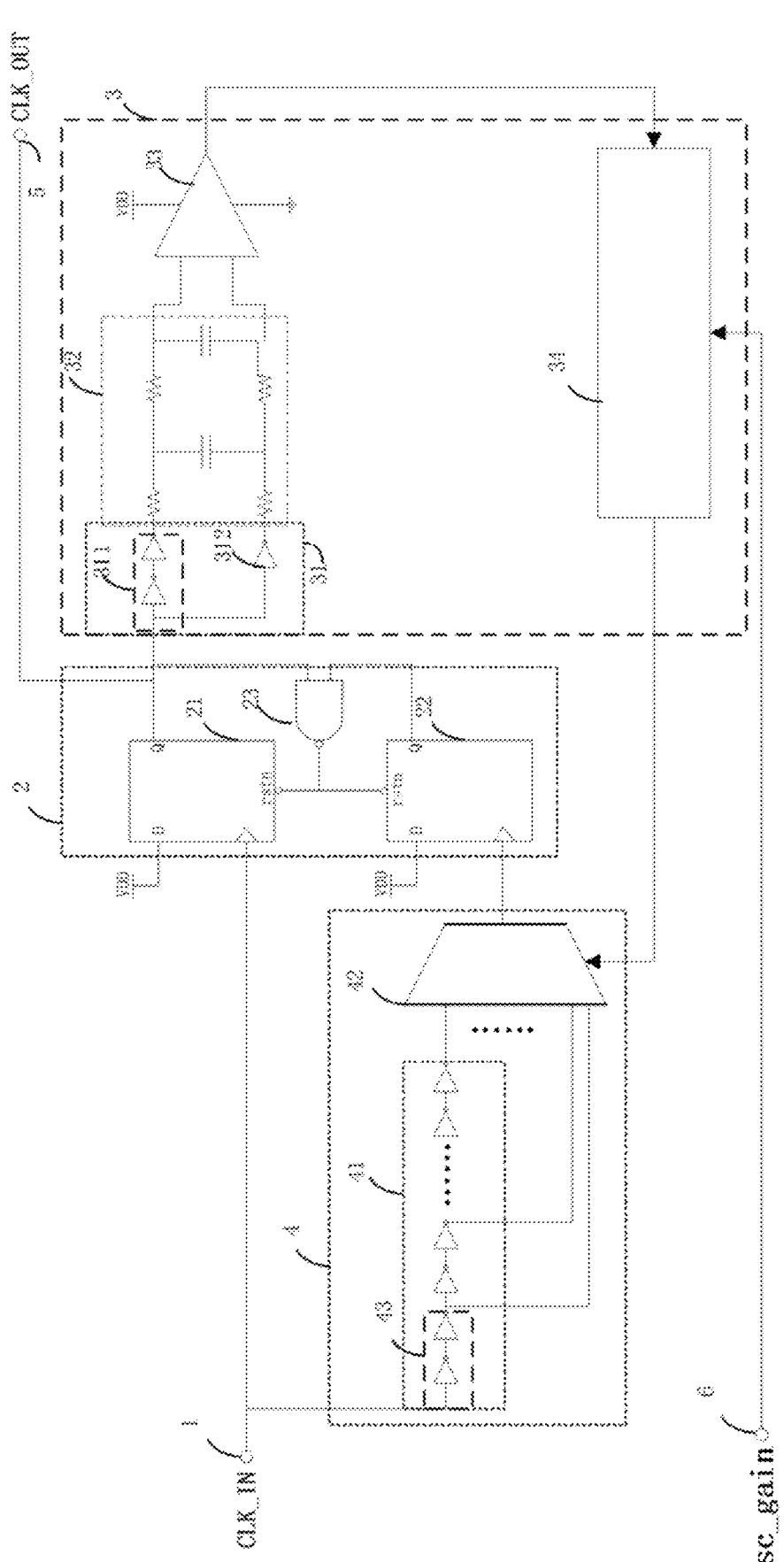
FIG. 1 is a schematic diagram of a duty cycle correction circuit according to an embodiment of the present application.

FIG. 1 shows a duty cycle correction circuit according to an embodiment of the present application. In this embodiment, the duty cycle correction circuit includes a signal input terminal 1, a signal output terminal 5, a signal adjustment circuit 2, a duty cycle detection circuit 3 and a digital control delay circuit 4.

The signal adjustment circuit 2 is electrically connected to the signal input terminal 1 and the signal output terminal 5, receives a first clock signal input from the signal input terminal 1, converts the first clock signal into a second clock signal, and outputs the second clock signal from the signal output terminal 5.

The duty cycle detection circuit 3 is electrically connected to the signal adjustment circuit 2 and is used to detect a duty cycle of the second clock signal and generate a feedback result.

The digital control delay circuit 4 is electrically connected to the duty cycle detection circuit 3, the signal adjustment circuit 2 and the signal input terminal 1 respectively, and is used to perform a corresponding delay operation on the second clock signal generated by the signal adjustment circuit, according to the feedback result.

In this embodiment, modern high-speed large-scale integrated circuits have increasingly higher requirements for the quality of clock signals. In addition to traditional clock jitter, a clock duty cycle in the quality of clock signals is also becoming a key factor affecting performance of high-speed integrated circuits, and clock signals with a duty cycle of 50% are particularly important in high-speed large-scale integrated circuits.

Specifically, when the signal adjustment circuit 2 receives a rising edge of the first clock signal input from the signal input terminal 1, the signal adjustment circuit 2 converts the first clock signal into a second clock signal and then outputs the second clock signal from the signal output terminal 5. The duty cycle detection circuit 3 is electrically connected to the signal adjustment circuit 2, and thus receives the second clock signal from the signal adjustment circuit 2. When the duty cycle detection circuit 3 receives the second clock signal, the duty cycle detection circuit 3 detects a duty cycle of the second clock signal and generates a feedback result. The digital control delay circuit 4 is electrically connected to the duty cycle detection circuit 3, the signal adjustment circuit 2 and the signal input terminal 1, respectively. When the digital control delay circuit 4 receives the feedback result, the digital control delay circuit 4 performs a corresponding delay operation, according to the feedback result, on the second clock signal generated by the signal adjustment circuit 2, thereby adjusting the duty cycle of the second clock signal to about 50%.

In the duty cycle correction circuit of this embodiment, the signal adjustment circuit receives an input first clock signal, and converts the first clock signal into the second clock signal; the duty cycle detection circuit is electrically connected to the signal adjustment circuit, and is used to detect a duty cycle of the second clock signal and generate a feedback result; the digital control delay circuit is electrically connected to the duty cycle detection circuit, the signal adjustment circuit and the signal input terminal, respectively, and is used to perform a corresponding delay operation, according to the feedback result, on the second clock signal generated by the signal adjustment circuit. The signal adjustment circuit, the duty cycle detection circuit and the digital control delay circuit in the duty cycle correction circuit can effectively solve conflict between establishment of accumulated time and loop stability, thereby satisfying the requirement of an input clock signal with a high-precision 50% duty cycle.

Further, the signal adjustment circuit 2 includes a first trigger 21, a second trigger 22 and a nand gate 23. A CK terminal of the first trigger 21 is electrically connected to a signal input terminal 1. A Q terminal of the first trigger 21 is electrically connected to the signal output terminal 5 and an end of the nand gate 23, respectively. A CK terminal of the second trigger 22 is electrically connected to the digital control delay circuit. A Q terminal of the second trigger 22 is electrically connected to an end of the nand gate 23. Another end of the nand gate 23 is electrically connected to reset terminals of the first trigger 21 and the second trigger 22, respectively.

In this embodiment, when the CK terminal of the first trigger 21 receives a rising edge of a first clock signal input from the signal input terminal, the first trigger 21 converts the first clock signal into a second clock signal, and outputs the second clock signal from the Q terminal of the first trigger 21 to the signal output terminal. After the second clock signal passes through the duty cycle detection circuit, a duty cycle of the second clock signal is detected, and a feedback result is generated. The feedback result is input into the digital control delay circuit. According to the feedback result, the digital control delay circuit controls output of a delay signal. The CK terminal of the second trigger 22 is electrically connected to the digital control delay circuit. When the CK terminal of the second trigger 22 receives the delay signal, the second clock signal at the Q terminal of the second trigger 22 passes through the nand gate 23, and the nand gate 23 converts the second clock signals at the Q terminal of the first trigger 21 and the Q terminal of the second trigger 22 into the first clock signal according to the delay signal.

Furthermore, the duty cycle detection circuit 3 includes an inverter 31, a filter 32, a comparator 33 and a finite state machine 34. Two ends of the inverter 31 are electrically connected to the Q terminal of the first trigger 21 and an input end of the filter 32, respectively. An output end of the filter circuit is electrically connected to an input end of the comparator 33. An output end of the comparator 33 is electrically connected to the finite state machine 34. The finite state machine 34 is electrically connected to the digital control delay circuit.

In this embodiment, the second clock signal is output from the Q terminal of the first trigger 21 to the signal output terminal; the second clock signal enters the filter 32 to obtain a common mode voltage of the second clock signal and its reverse signal; and the common mode voltage of the second clock signal and its inverse signal is input to the comparator 33 for comparison. If a voltage of a positive input end of the comparator 33 is higher than a voltage of a negative input end of the comparator 33, 1 is output, otherwise 0 is output. That is, judging whether a current duty cycle of the second clock signal is greater than or less than 50%, and results of multiple judgments are input to the finite state machine 34. The finite state machine 34 processes the comparison results and inputs a processing result into the digital control delay circuit. The digital control delay circuit will delay the rising edge of the first clock signal and then send it to the second trigger 22 to convert the second clock signal into the first clock signal. An operational amplifier directly connected to the loop is replaced by the comparator connected to the digital circuit, thereby avoiding the loop stability problem caused by the high gain of the operational amplifier which is directly connected.

Further, the inverter 31 further includes a two-stage inverter 311 and a one-stage inverter 312. Two ends of the two-stage inverter 311 are electrically connected to the Q terminal of the first trigger 21 and the positive input end of the filter 32, respectively. Two ends of the one-stage inverter 312 are electrically connected to the Q terminal of the first trigger 21 and the negative input end of the filter 32.

In this embodiment, an in-phase signal obtained after the second clock signal passes through the two-stage inverter 311, is input to the filter 32 in a positive direction; an inverted signal of the second clock signal obtained after the second clock signal passes through the first-stage inverter 312, is input to the filter 32 in a negative direction. An output of the filter 32 is corresponding to the input common-mode voltage, that is, a ratio of high levels to a total cycle multiplied by high-level voltage values. Then, the common-mode voltage outputted positively by the filter 32 is inputted into the positive input terminal of the comparator 33, and the common-mode voltage outputted negatively by the filter 32 is inputted into the negative input terminal of the comparator 33.

Figure 2:
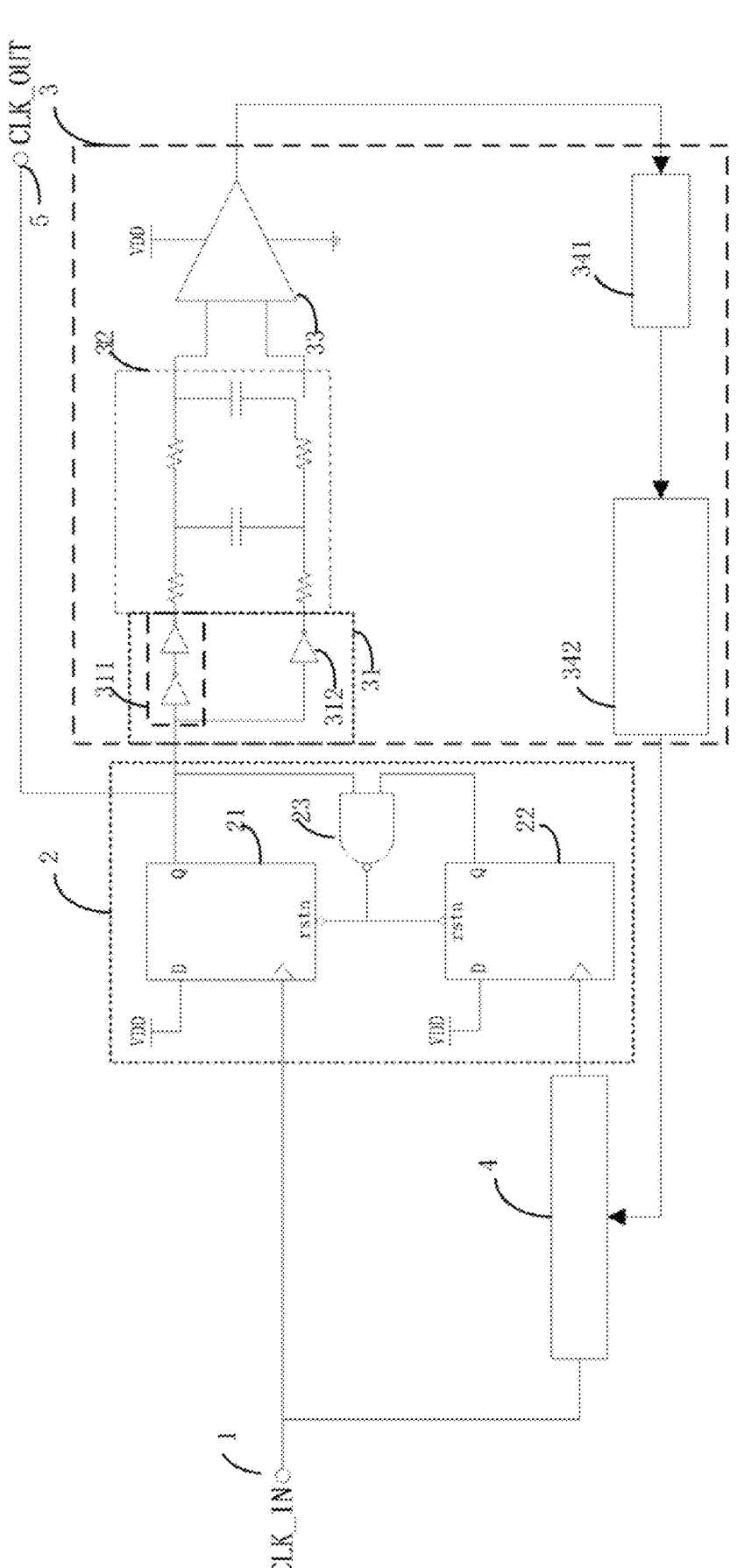
FIG. 2 is a schematic diagram of a duty cycle correction circuit according to an embodiment of the present application.

Further, as shown in FIG. 2, the finite state machine 34 includes a voter 341 and a counter 342. The output end of the comparator 33 is electrically connected to an end of the voter 341. Another end of the voter 341 is electrically connected to an end of the counter 342. Another end of the counter 342 is electrically connected to an end of the digital control delay circuit.

In this embodiment, the second clock signal is output from the Q terminal of the first trigger 21 to the signal output end; and the second clock signal enters the filter 32 to obtain the common mode voltage of the second clock signal and its reverse signal. The common mode voltage of the second clock signal and its reverse signal is sent to the comparator 33 for comparison. If a voltage of the positive input end of the comparator 33 is higher than the negative input end of the comparator 33, 1 is output, otherwise 0 is output, that is, judging whether a current duty cycle of the second clock signal is greater than or less than 50%. The comparison result is subject to majority voting by the voting unit 341. According to the voting result, if the voter 341 votes more 1 within a certain period of time, the counter 342 is reduced by 1; and if the voter 341 votes more 0, the counter 342 is increased by 1. The result of the counter 342 will control the delay of the digital control delay circuit, thereby changing the duty cycle. The filtering function is divided into two parts performed by the filter and the voter, thereby avoiding the conflict between establishment of accumulated time and loop stability caused by resistance and capacitance of the filter circuit. The voter is added to perform partial filtering functions, so that an early rapid establishment and low duty cycle jitter after establishment can be achieved through simple initialization and rapid establishment mode.

Further, the finite state machine 34 is further configured with a gain configuration bit 6.

In this embodiment, the finite state machine 34 is further configured with a gain configuration bit 6, which is used to determine a value of an input configuration.

It is to be noted that, in order to speed up the finite state machine 34 to establish an accumulated value of the current cycle, the larger the gain, the faster it is established. However, if the gain is not adjusted down after establishment, the duty cycle will fluctuate greatly. Therefore, the gain is adjusted to a reasonable threshold only in a first part of the cycle.

Another method to speed up the finite state machine 34 to establish the accumulated value of the current cycle is to directly give an estimated establishment value in advance, to reduce an intermediate establishment time. Since this estimated value may not be accurate, it may deviate greatly under different PVT conditions. The two different methods can be used in combination, but there is no comparison of which one is faster because the reduced time is not a fixed value.

Furthermore, the digital control delay circuit 4 includes a selector 42 and a delay chain 41 including a plurality of inverter groups 43 connected in series. An input end of the delay chain 41 is electrically connected to the signal input terminal 1. An output end of each inverter group 43 is electrically connected to an input end of the selector 42. An output end of the selector 42 is electrically connected to the signal adjustment circuit.

In this embodiment, the delay chain 41 is used to make a delay; and the input end of the selector 42 receives many different delays of the signal input end. According to the current feedback result, the selector 42 selects which delayed signal to output. An analog voltage-controlled delay line is changed to a digitally controlled delay chain, thereby avoiding the loop stability problem caused by gain change of the voltage-controlled delay line when adjusting within a large frequency range.

Figure 3:
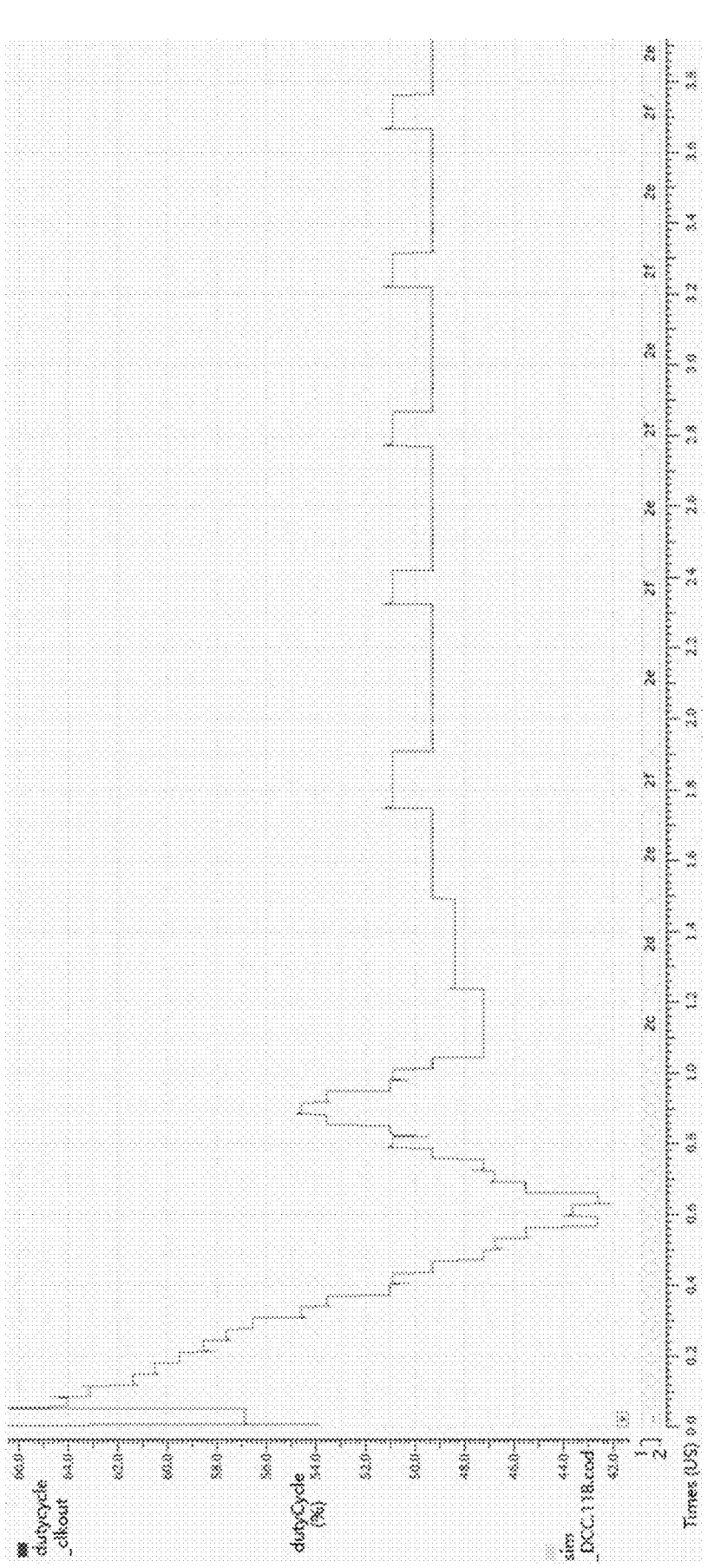
FIG. 3 is a simulation diagram of a duty cycle correction circuit according to an embodiment of the present application.

Specifically, for example, after the rising edge of the first clock signal passes through the first trigger 21, the filter 32 takes out the common mode voltage of the second clock signal and its reverse signal and sends the common mode voltage of the second clock signal and its reverse signal to the comparator 33. After the result of the comparator 33 enters the finite state machine 34, the finite state machine 34 first performs a 0/1 judgment to determine whether the current data is addition or subtraction, and then multiplies the current data by a configured multiple (1/2/4/8) and then is accumulated with data stored in the cumulative number of the current cycle. In order to speed up the establishment speed, within the first 512 cycles after initialization, the input configuration gain will be directly set to 16; and after the end of 512 cycles, it will be switched to the multiple set by the configuration bit. In addition, the establishment speed can also be accelerated by directly setting an initial cumulative number of the current cycle. A bit width of the cumulative number of the current cycle is set to 11 bits, and finally output control codes are the high 7 bits of the bit width of the cumulative number of the current cycle, so that the low 4 bits of the cumulative number of the current cycle will become voting count; the control code will change once only if 1 or 0 appears 16 times more in total. Through the control code, the 7-128 selector 42 sends signals at different positions on the digital control delay circuit to the CK terminal of the second trigger 22. The simulation result of this scheme is shown in FIG. 3, where a vertical axis represents a duty cycle of an output second clock signal and a horizontal axis represents time used. It can be seen that only 1.6 us is required to achieve establishment and ripple is only delay of two inverters.

Furthermore, the inverter group 43 includes at least two inverters 31 connected in series.

In this embodiment, the inverter group 43 includes at least two inverters 31 connected in series. The inverter group 43 is used to make a delay. When establishment time of the first clock signal and the second clock signal is similar, the duty cycle is adjusted towards 50%.

The above content is a further detailed explanation of the present application, but they are only examples, and it cannot be determined that the specific implementation of the present application is limited to these explanations. For those of ordinary skill in the art to which the present application belongs, several simple deductions or substitutions can be made without departing from the concept of the present application, and all of them should be considered as the scope of protection of the present application.

What is claimed is:

1. A duty cycle correction circuit, comprising:
   a signal input terminal and a signal output terminal;
   a signal adjustment circuit electrically connected to the signal input terminal and the signal output terminal, respectively; wherein the signal adjustment circuit is configured to receive a first clock signal input from the signal input terminal, convert the first clock signal into a second clock signal and output the second clock signal from the signal output terminal;
   a duty cycle detection circuit electrically connected to the signal adjustment circuit;
   wherein the duty cycle detection circuit is configured to detect a duty cycle of the second clock signal and generate a feedback result; and a digital control delay circuit electrically connected to the duty cycle detection circuit, the signal adjustment circuit and the signal input terminal, respectively; wherein digital control delay circuit is configured to, according to the feedback result, perform a corresponding delay operation on the first clock signal to adjust the duty cycle of the second clock signal.

2. The duty cycle correction circuit according to claim 1, wherein the signal adjustment circuit includes a first trigger, a second trigger and a nand gate; a CK terminal of the first trigger is electrically connected to the signal input terminal; a Q terminal of the first trigger is electrically connected to the signal output terminal and an end of the nand gate, respectively; a CK terminal of the second trigger is electrically connected to the digital control delay circuit; a Q terminal of the second trigger is electrically connected to an end of the nand gate; another end of the nand gate is electrically connected to reset terminals of the first trigger and the second trigger, respectively.

3. The duty cycle correction circuit according to claim 2, wherein the duty cycle detection circuit includes an inverter, a filter, a comparator and a finite state machine; two ends of the inverter are electrically connected to the Q terminal of the first trigger and an input end of the filter, respectively; an output end of the filter is electrically connected to an input end of the comparator; an output end of the comparator is electrically connected to the finite state machine; the finite state machine is electrically connected to the digital control delay circuit.

4. The duty cycle correction circuit according to claim 3, wherein the inverter further includes a two-stage inverter and a one-stage inverter; two ends of the two-stage inverter are electrically connected to the Q terminal of the first trigger and a positive input end of the filter, respectively; two ends of the one-stage inverter are electrically connected to the Q terminal of the first trigger and a negative input end of the filter.

5. The duty cycle correction circuit according to claim 3, wherein the finite state machine includes a voter and a counter; the output end of the comparator is electrically connected to an end of the voter; another end of the voter is electrically connected to an end of the counter; another end of the counter is electrically connected to an end of the digital control delay circuit.

6. The duty cycle correction circuit according to claim 3, wherein the finite state machine is further configured to receive a gain configuration bit.

7. The duty cycle correction circuit according to claim 1, wherein the digital control delay circuit includes a selector and a delay chain including a plurality of inverter groups connected in series; an input end of the delay chain is electrically connected to the signal input terminal; an output end of each inverter group is electrically connected to an input end of the selector; an output end of the selector is electrically connected to the signal adjustment circuit.

8. The duty cycle correction circuit according to claim 7, wherein each inverter group includes at least two inverters connected in series.

* * * * *